United States Patent
Do et al.

(10) Patent No.: US 7,829,998 B2
(45) Date of Patent: Nov. 9, 2010

(54) SEMICONDUCTOR WAFER HAVING THROUGH-HOLE VIAS ON SAW STREETS WITH BACKSIDE REDISTRIBUTION LAYER

(75) Inventors: Byung Tai Do, Singapore (SG); Heap Hoe Kuan, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 281 days.

(21) Appl. No.: 11/861,244

(22) Filed: Sep. 25, 2007

(65) Prior Publication Data

US 2008/0272464 A1  Nov. 6, 2008

Related U.S. Application Data

(63) Continuation-in-part of application No. 11/768,844, filed on Jun. 26, 2007, which is a continuation-in-part of application No. 11/744,657, filed on May 4, 2007, now Pat. No. 7,569,421.

(51) Int. Cl.
   *H01L 23/04* (2006.01)
(52) U.S. Cl. ............... 257/698; 257/774; 257/E21.597
(58) Field of Classification Search ............... None
   See application file for complete search history.

(56) References Cited

U.S. PATENT DOCUMENTS

| | | | |
|---|---|---|---|
| 5,694,551 A | 12/1997 | Doyle et al. | |
| 6,157,915 A | 12/2000 | Bhaskaran et al. | |
| 6,611,052 B2 * | 8/2003 | Poo et al. | 257/686 |
| 6,743,696 B2 | 6/2004 | Jeung et al. | |
| 6,800,930 B2 * | 10/2004 | Jackson et al. | 257/700 |
| 6,856,023 B2 * | 2/2005 | Muta et al. | 257/774 |
| 6,914,327 B2 * | 7/2005 | Shizuno | 257/698 |
| 6,949,407 B2 * | 9/2005 | Jeung et al. | 438/106 |
| 2002/0013721 A1 | 1/2002 | Dabbiere et al. | |
| 2002/0019761 A1 | 2/2002 | Lidow | |
| 2002/0042755 A1 | 4/2002 | Kumar et al. | |
| 2002/0049622 A1 | 4/2002 | Lettich et al. | |
| 2004/0119152 A1 * | 6/2004 | Karnezos et al. | 257/686 |

OTHER PUBLICATIONS

Jiang et al. "Characterization of Epoxy Resin SU-8 Film Using Thickness-Shear Mode (TSM) Resonator" Proceedings of the 2003 IEEE International Frequency Control Symposium and PDA Exhibition Jointly with the 17th European Frequency and Time Forum, May 4-8, 2003, pp. 986-992.*

* cited by examiner

*Primary Examiner*—W. David Coleman
*Assistant Examiner*—Shaka Scarlett
(74) *Attorney, Agent, or Firm*—Robert D. Atkins

(57) ABSTRACT

A semiconductor wafer contains a plurality of die with contact pads disposed on a first surface of each die. Metal vias are formed in trenches in the saw street guides and are surrounded by organic material. Traces connect the contact pads and metal vias. The metal vias can be half-circle vias or full-circle vias. The metal vias are surrounded by organic material. Redistribution layers (RDL) are formed on a second surface of the die opposite the first surface. The RDL and THV provide expanded interconnect flexibility to adjacent die. Repassivation layers are formed between the RDL on the second surface of the die for electrical isolation. The die are stackable and can be placed in a semiconductor package with other die. The RDL provide electrical interconnect to the adjacent die. Bond wires and solder bumps also provide electrical connection to the semiconductor die.

25 Claims, 16 Drawing Sheets

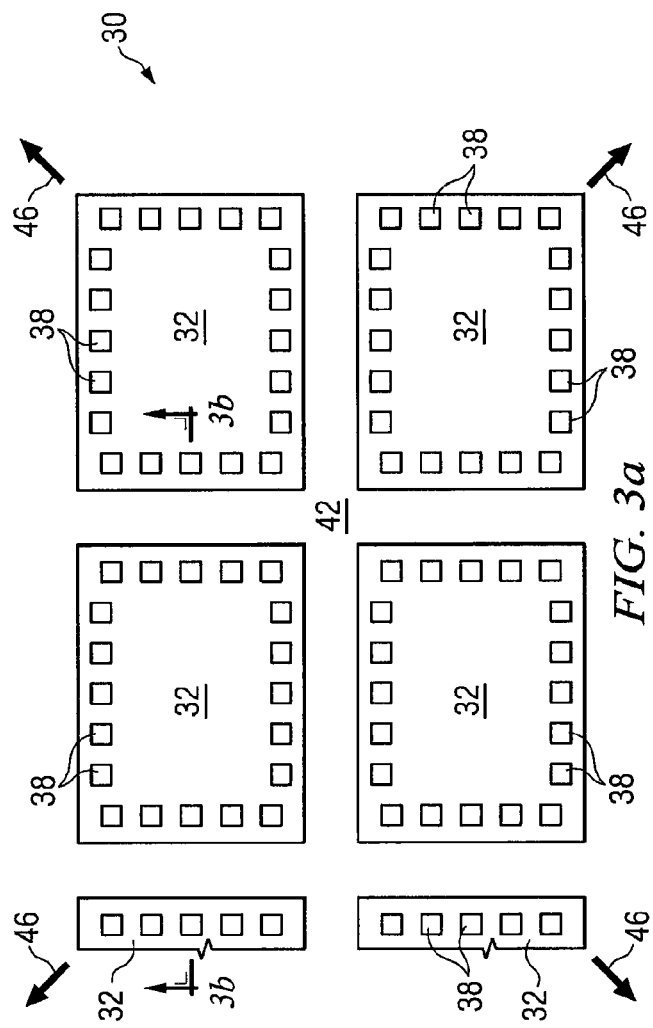
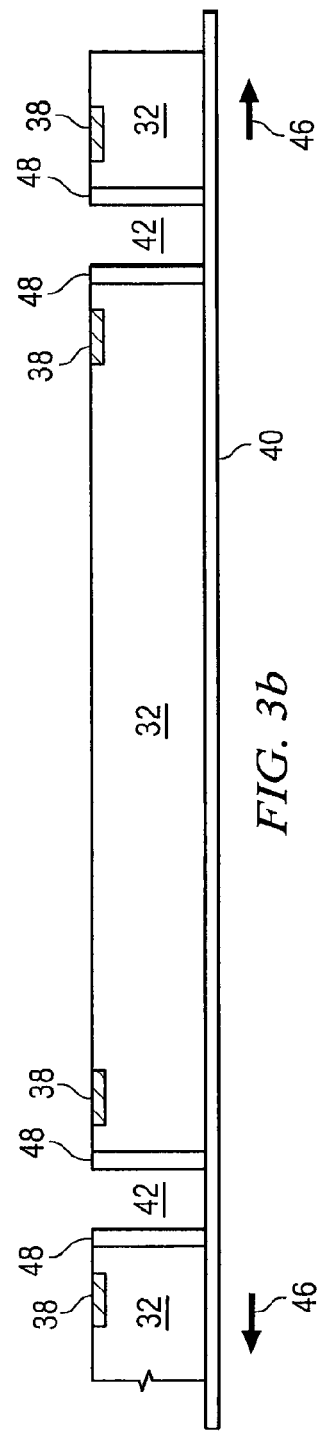
FIG. 3a
FIG. 3b

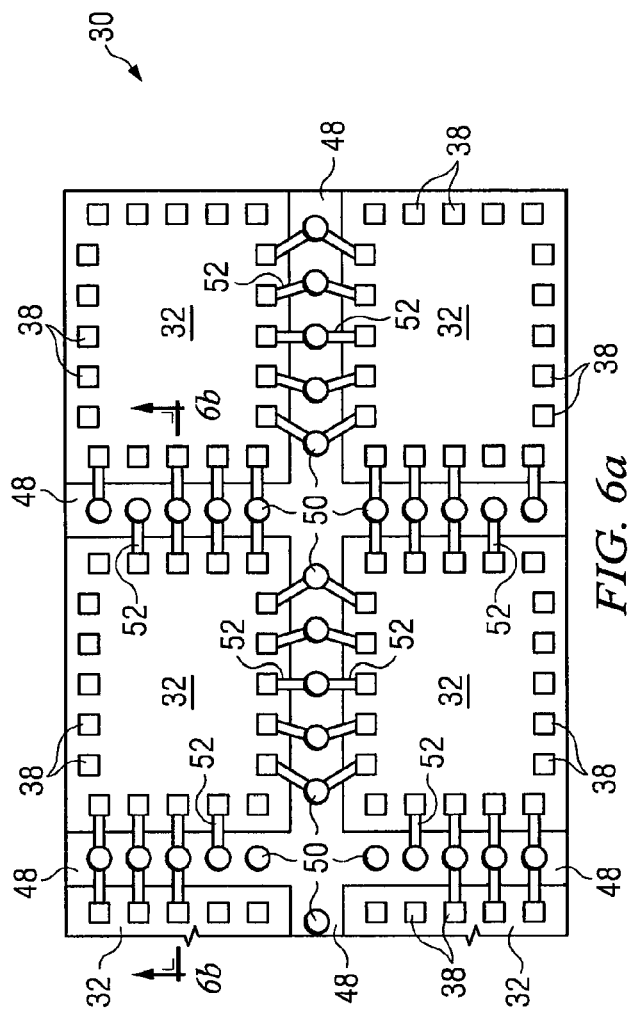
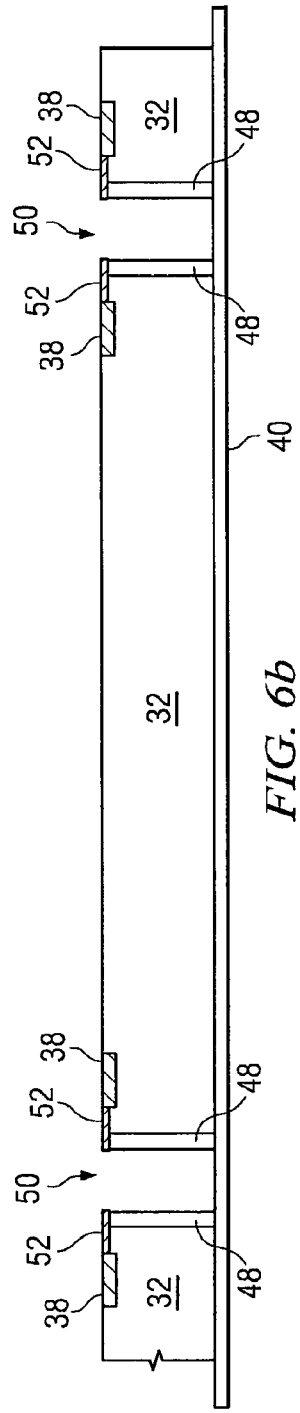
FIG. 6a
FIG. 6b

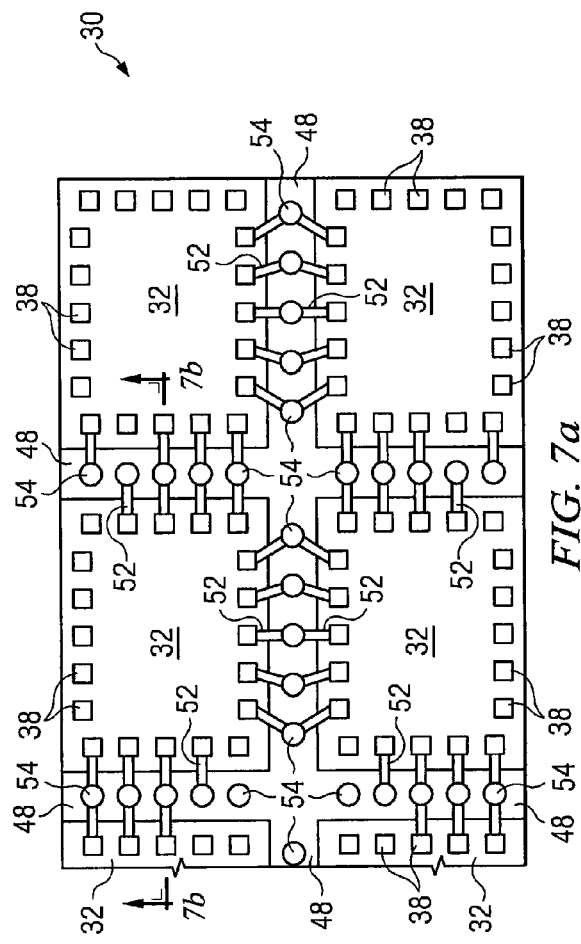
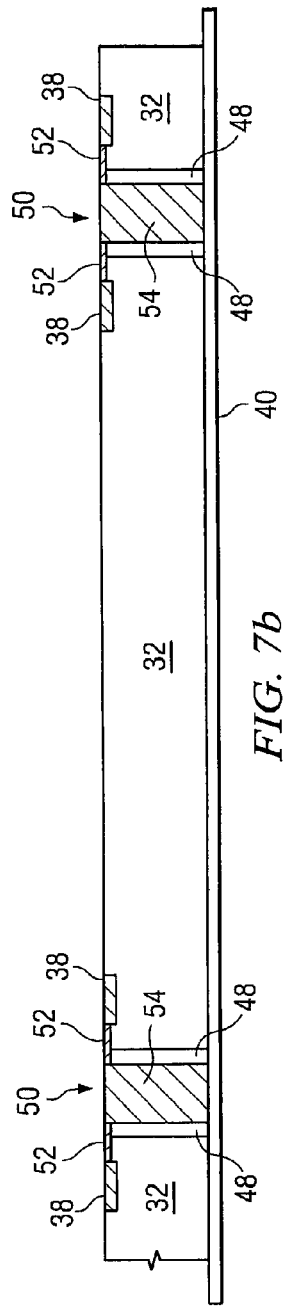

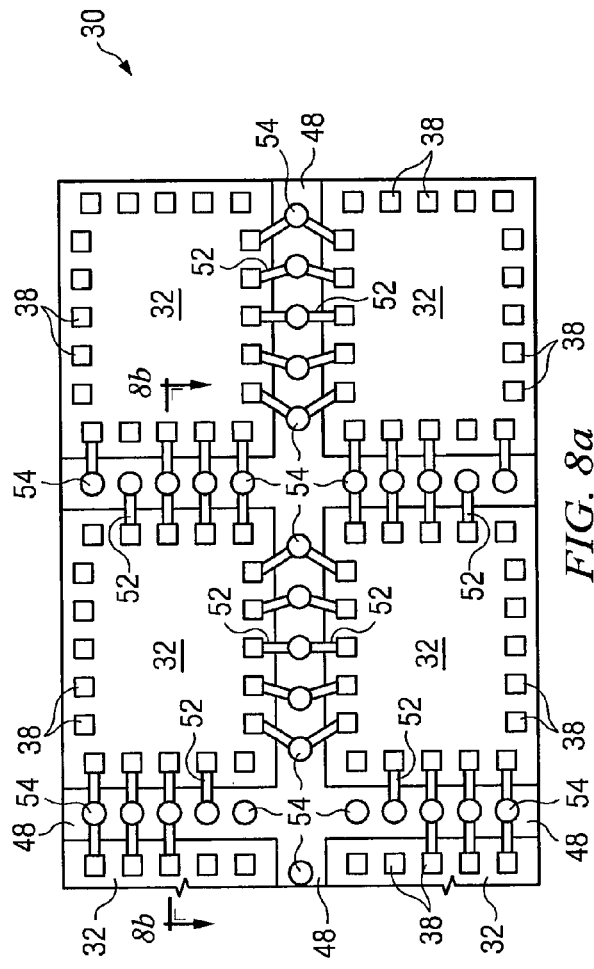
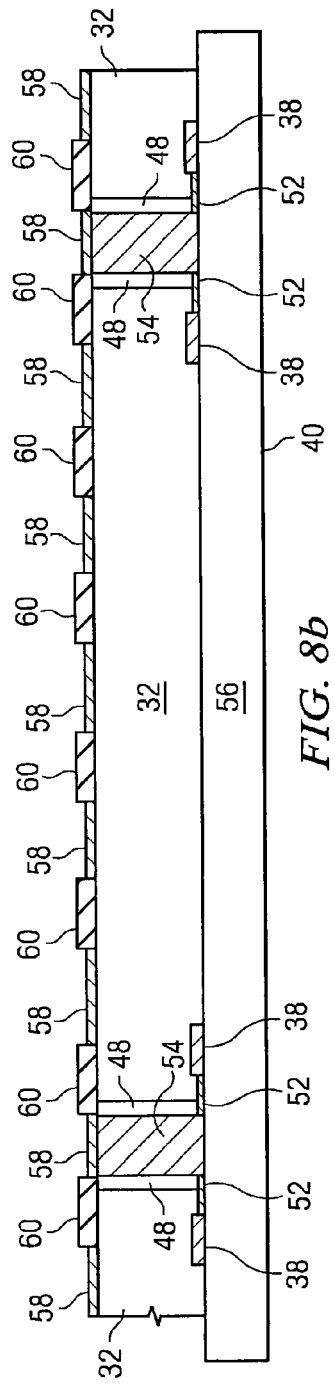
FIG. 8a
FIG. 8b

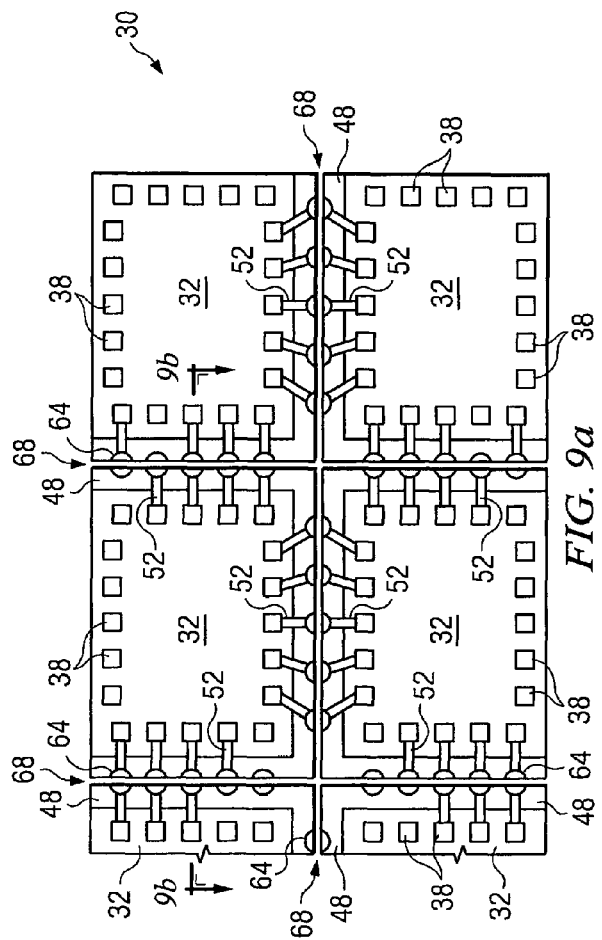
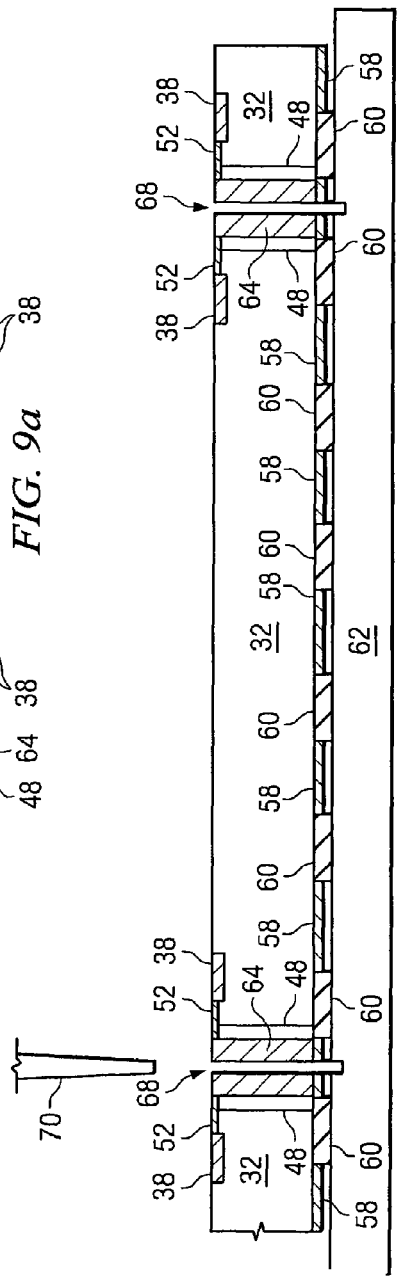

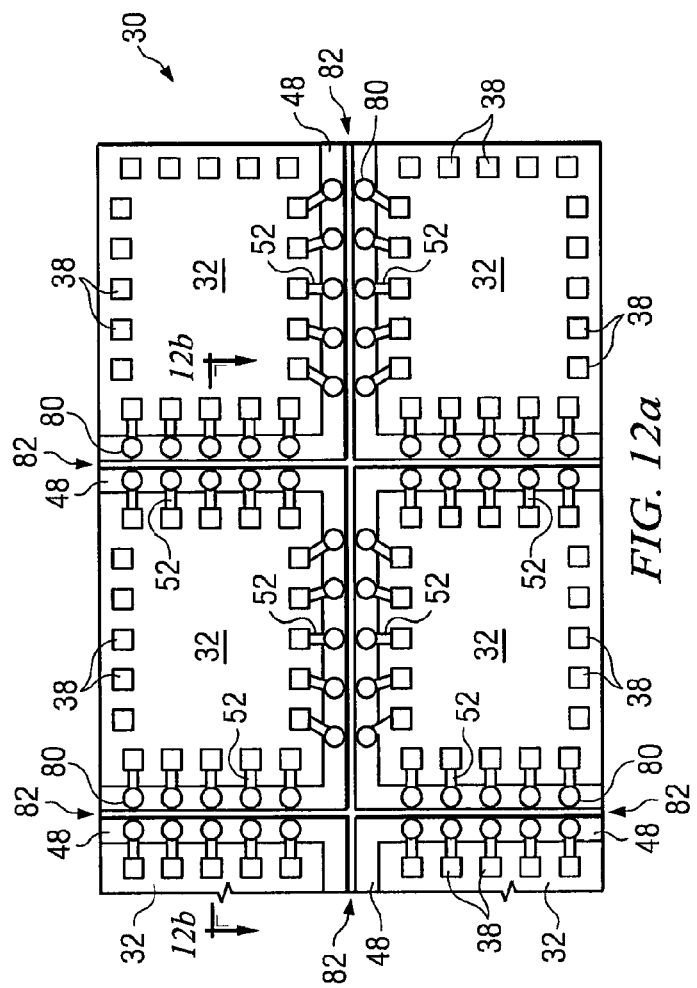

SEMICONDUCTOR WAFER HAVING THROUGH-HOLE VIAS ON SAW STREETS WITH BACKSIDE REDISTRIBUTION LAYER

CLAIM TO DOMESTIC PRIORITY

The present invention is a continuation-in-part application of U.S. patent application Ser. No. 11/768,844, entitled "Package on Package Using Through-Hole Via Die on Saw Streets" and filed Jun. 26, 2007, which is a continuation-in-part of U.S. patent application Ser. No. 11/744,657, "Through-Hole Via on Saw Streets" and filed May 4, 2007 now U.S. Pat. No. 7,569,421, and claims priority to the foregoing parent applications pursuant to 35 U.S.C. §120.

CROSS-REFERENCE TO RELATED PATENT APPLICATIONS

The present patent application is related to copending U.S. patent application Ser. No. 11/891,233, entitled "Semiconductor Package having Through Hole Via on Saw Streets formed with Partial Saw," and filed concurrently herewith by Byung Tai Do et al. The present patent application is further related to copending U.S. patent application Ser. No. 11/861,251, entitled "Semiconductor Die with Through-Hole Via on Saw Streets and Through-Hole Via in Active Area of Die," and filed concurrently herewith by Byung Tai Do et al.

FIELD OF THE INVENTION

The present invention relates in general to semiconductor packaging and, more particularly, to stackable semiconductor die having through-hole vias formed along saw streets with backside redistribution layers.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

Semiconductor manufacturers are increasingly adopting packaging techniques which involve three-dimensional (3D) interconnects between the semiconductor devices. The 3D interconnects provide advantages such as size reduction, reduced interconnect length, and integration of devices with different functionality into an overall 3D package. One way of implementing 3D interconnects involves the use of through-hole vias (THV). THVs are typically located around the perimeter of the die along its saw street guides. Most, if not all, semiconductor packages use the THVs to route signals between adjacent die. However, THVs alone limit signal routing options and reduce signal routing density. Present day high density packaging require high density and flexible interconnect capability, which is difficult to achieve through THVs.

A need exists to increase signal routing options and density in a semiconductor wafer having THVs.

SUMMARY OF THE INVENTION

In one embodiment, the present invention is a method of forming a semiconductor wafer comprising the steps of forming a semiconductor wafer having a plurality of die with contact pads disposed on a first surface of each die, the semiconductor wafer having saw street guides between each die, forming a trench in the saw street guides, filling the trench with organic material, forming a plurality of via holes in the organic material, forming traces between the contact pads and via holes, depositing conductive material in the via holes to form metal vias, forming redistribution layers (RDL) on a second surface of the die opposite the first surface, forming repassivation layers between the RDL on the second surface of the die, and singulating the semiconductor wafer along the saw street guides to separate the die into individual units.

In another embodiment, the present invention is a semiconductor wafer comprising a plurality of die with contact pads disposed on a first surface of each die. The semiconductor wafer has saw street guides between each die. A plurality of metal vias is formed in the saw street guides and is surrounded by organic material. A plurality of traces connects the contact pads and metal vias. A plurality of RDLs is formed on a second surface of the die opposite the first surface. A plurality of repassivation layers is formed between the RDLs on the second surface of the die.

In another embodiment, the present invention is a semiconductor package comprising a plurality of stacked die. Each die includes a plurality of contact pads disposed on a first surface of the die, a plurality of metal vias formed along a perimeter of the die, a plurality of traces electrically connecting the metal vias to the contact pads, a plurality of RDLs formed on a second surface of the die opposite the first surface, and a plurality of repassivation layers formed between the RDLs on the second surface of the die. The RDLs provide electrical interconnect between the stacked die.

In another embodiment, the present invention is a semiconductor package comprising a first semiconductor die having contact pads and metal vias formed on a first surface along a perimeter of the die electrically connected to the contact pads through a plurality of traces. The first semiconductor die further includes a plurality of RDLs formed on a second surface of the die opposite the first surface and a plurality of repassivation layers formed between the RDL on the second surface of the die. A second semiconductor die is disposed adjacent to the first semiconductor die and is electrically connected to the first semiconductor die through the RDLs.

BRIEF DESCRIPTION OF THE DRAWINGS

FIGS. 3a-3b illustrate top and side views of an expansion of the saw streets;

FIGS. 6a-6b illustrate top and side views of forming conductive traces between the contact pads and via holes;

FIGS. 7a-7b illustrate top and side views of depositing conductive material in the via holes;

FIGS. 8a-8b illustrate top and side views of forming backside redistribution layers and repassivation layers;

FIGS. 9a-9b illustrate top and side views of cutting the metal vias into two half-circle vias;

FIGS. 12a-12b illustrate top and side views of cutting the organic material between the two side-by-side metal vias to separate the die;

DETAILED DESCRIPTION OF THE DRAWINGS

Figure 1A:
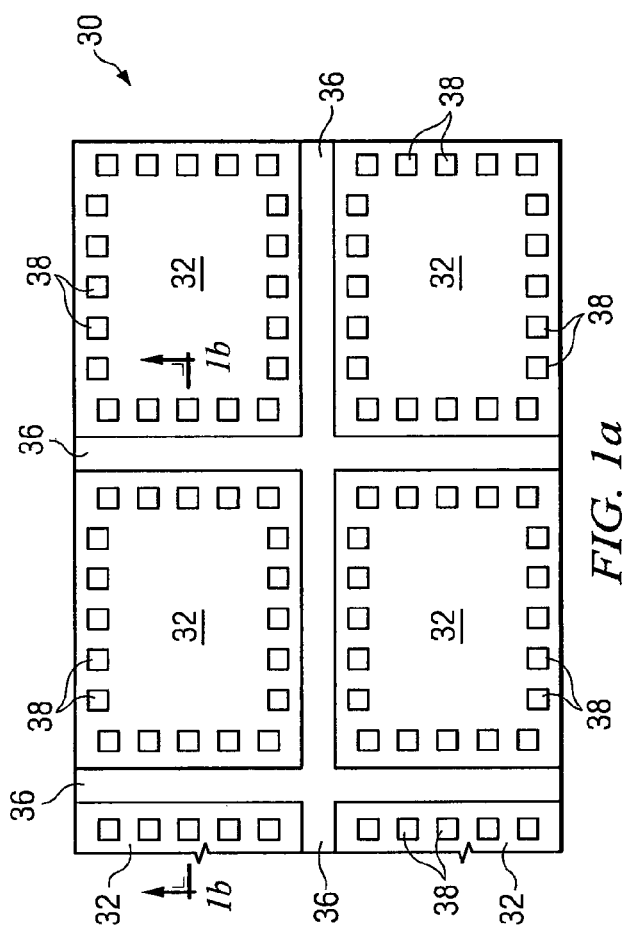
FIGS. 1a-1b illustrate top and side views of a semiconductor wafer having a plurality of die separated by saw street guides.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material by thermal diffusion or ion implantation. The active surface is substantially planar and uniform with electrical interconnects, such as bond pads.

Flip chip semiconductor packages and wafer level chip scale packages (WLP) are commonly used with integrated circuits (ICs) demanding high speed, high density, and greater pin count. Flip chip style packaging involves mounting an active area of the die facedown toward a chip carrier substrate or printed circuit board (PCB). The active area contains active and passive devices, conductive layers, and dielectric layers according to the electrical design of the die. The electrical and mechanical interconnect is achieved through a solder bump structure comprising a large number of individual conductive solder bumps or balls. The solder bumps are formed on the bump pads which are disposed on the active area. The bump pads connect to the active circuits by conduction tracks or traces in the active area. The solder bumps are electrically and mechanically connected to the contact pads on the carrier substrate by a solder reflow process. The flip chip semiconductor package provides a short electrical conduction path from the active devices on the die to conduction tracks on the carrier substrate in order to reduce signal propagation, lower capacitance, and achieve overall better circuit performance.

In the present discussion, a WLP is provided having through-hole vias (THV) formed along saw streets. The backside of the wafer has redistribution layers (RDL) for interconnect flexibility separated by repassivation layers. WLP with THV formed along saw streets are described in U.S. patent application Ser. No. 11/744,657, entitled "Through-Hole Via on Saw Streets", and further in U.S. patent application Ser. No. 11/768,844, entitled "Package on Package Using Through-Hole Via Die on Saw Streets", which are incorporated herein by reference.

Turning to FIG. 1a, a semiconductor wafer 30 is shown having a plurality of die 32. The die are separated by inter die wafer area 36, commonly known as saw street guides. The saw street guides are routed around the wafer such that there is a saw street on every side of each die on the wafer, i.e., around a perimeter of the die. Each die 32 has a plurality to contact pads 38 formed on an active side of the die. Contact pads 38 are made of aluminum, copper, or aluminum/copper alloys. Contact pads 38 electrically connect to active and passive devices through conduction tracks or layers formed on die 32. The contact pads can be disposed side-by-side a first distance from the edge of the die, as shown in FIG. 1a. Alternately, the contact pads can be offset in multiple rows such that a first row of contact pads are disposed a first distance from the edge of the die, and a second row of contact pads alternating with the first row are disposed a second distance from the edge of the die. A solder bump or wire bond will later be formed to connect to each metal contact pad for electrical and mechanical interconnect to a chip carrier substrate or printed circuit board (PCB).

Figure 1B:
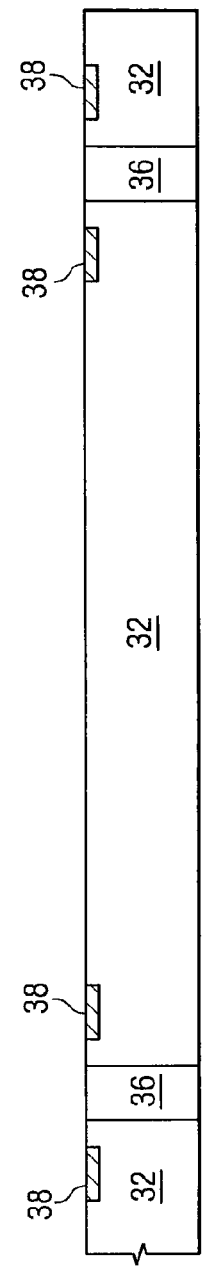

FIG. 1b is a cross-sectional view of wafer 30, taken along line 1b-1b in FIG. 1a, showing die 32 separated by saw street guides 36. In one embodiment, die 32 may have dimensions ranging from 2×2 millimeters (mm) to 15×15 mm. The saw streets provide cutting areas to singulate the wafer into individual die. A first die 32 is disposed to the left of the leftmost saw street 36. A second die 32 is disposed between the saw streets 36. A third die 32 is disposed to the right of the rightmost saw street 36. Once the wafer is singulated, each set of contact pads disposed on the respective die will provide the electrical and mechanical interconnect for that die.

Figure 2A:
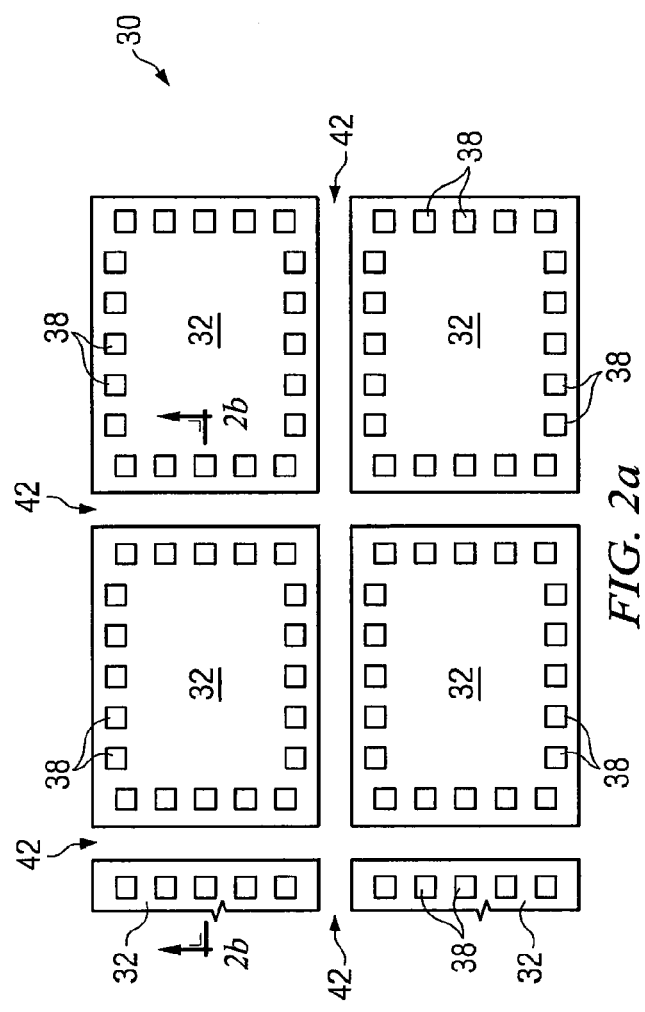
FIGS. 2a-2b illustrate top and side views of the semiconductor wafer with cut saw street guides.
Figure 2B:
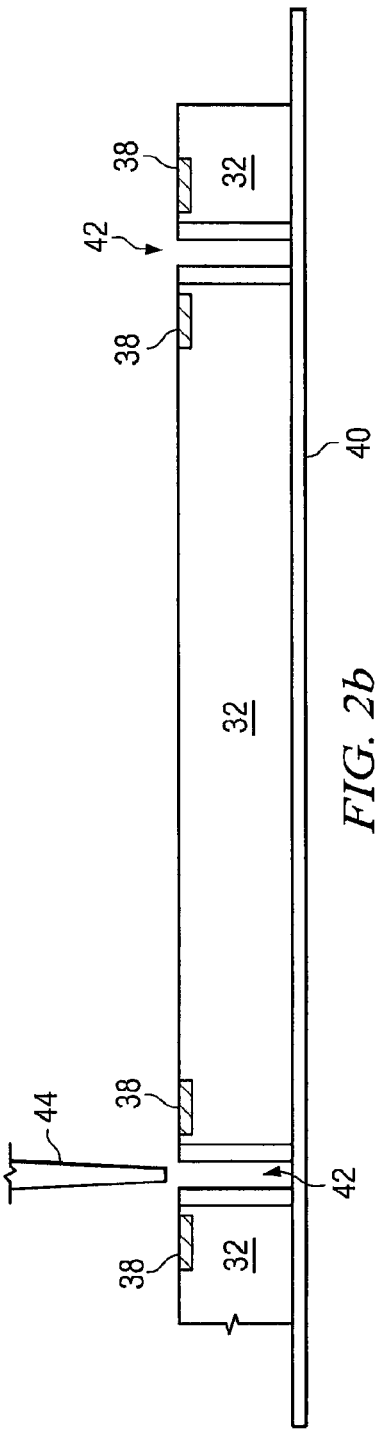

In FIG. 2a, semiconductor wafer 30 is again shown with its plurality of die 32, separated by saw street guides 36. Dicing tape 40 is applied to the back of semiconductor wafer 30 for structural support of the wafer during the following manufacturing operations, as shown in FIG. 2b which is a cross-sectional view taken along line 2b-2b in FIG. 2a. Saw streets 36 are cut by cutting tool 44. In one embodiment, cutting tool 44 can be a saw or laser. Note that the cutting tool completely severs through wafer 30 to form a well or trench 42. The bottom of trench 42 is defined by dicing tape 40. The formation of trench 42 arises from a first singulation of wafer 30, which creates a trench width that is less than a width of the channel of saw street guide 36.

In FIG. 3a, semiconductor wafer 30 is shown with its plurality of die 32, separated by cut saw street guides 36. Wafer 30 undergoes a wafer expansion step to increase the width of saw street guides 36. FIG. 3b is a cross-sectional view of wafer 30, taken along line 3b-3b, showing the die being pulled using a wafer expansion table as shown by directional arrows 46. Alternately, the die can be picked and placed onto a wafer support system. In any case, the die are positioned farther apart following the steps of FIGS. 3a-3b to create wider saw street guides. In one embodiment, the die separation increases from 50 micrometers (μm) to 200 μm. The expanded dimension depends on the design embodiment, i.e. half via, full via, single row via, or double/multiple row via.

Figure 4A:
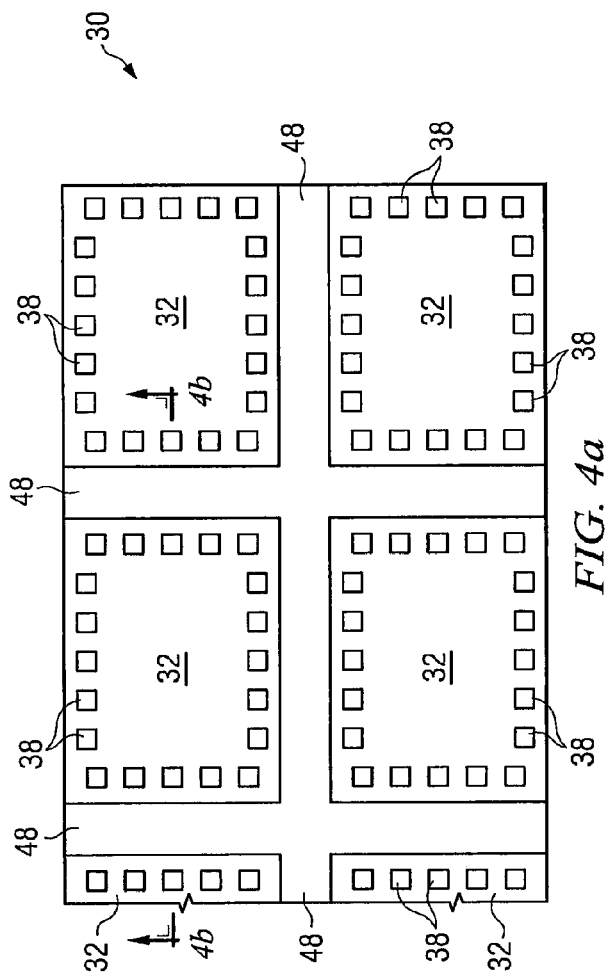
FIGS. 4a-4b illustrate top and side views of the expanded saw streets filled with organic material.
Figure 4B:
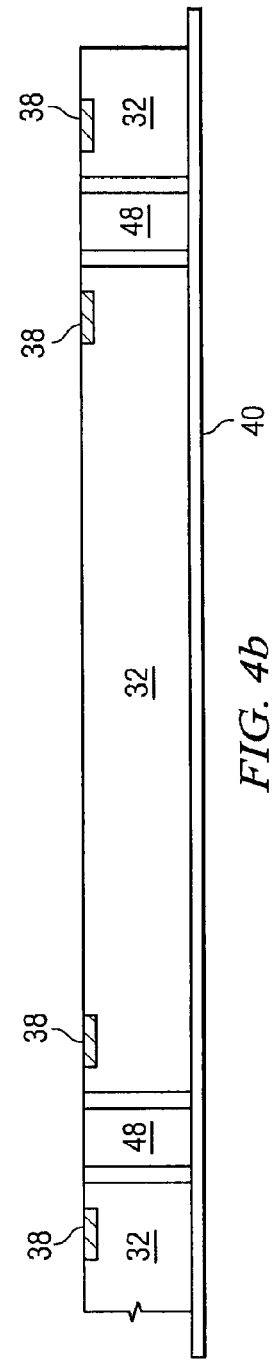

In FIG. 4a, semiconductor wafer 30 is shown with its plurality of die 32, separated by cut saw street guides 36. Organic material 48 is deposited in trench 42 by spin-coating or needle dispensing. Organic material 48 can be benzocyclobutene (BCB), polyimide (PI), or acrylic resin. FIG. 4b is a cross-sectional view of wafer 30, taken along line 4b-4b, showing organic material 48 deposited in trench 42. Organic material 48 fills trench 42 from dicing tape 40 up to the top surface of die 32.

Figure 5A:
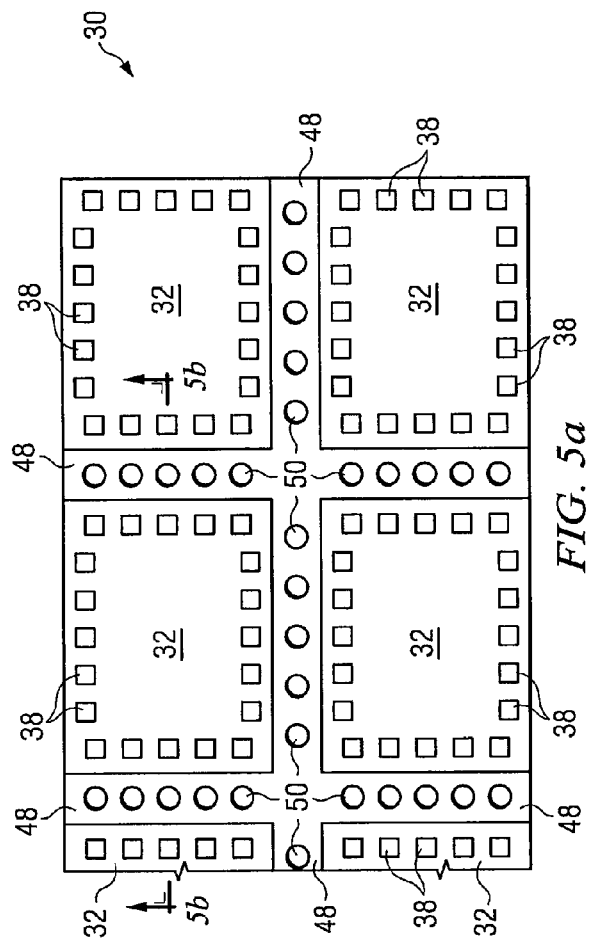
FIGS. 5a-5b illustrate top and side views of forming via holes through the organic material in the saw streets.

In FIG. 5a, semiconductor wafer 30 is shown with its plurality of die 32, separated by saw street guides 36 filled with organic material 48. A via hole 50 is cut into organic material 48 along saw streets 36. The via cutting operation uses a laser drill or etching process. Via holes 50 are placed along die 32 adjacent to contact pads 38. In one embodiment, contact pads 38 and via holes 50 have a minimum separation distance of about 20 μm to 150 μm, depending on the diameter and depth of the via.

Figure 5B:
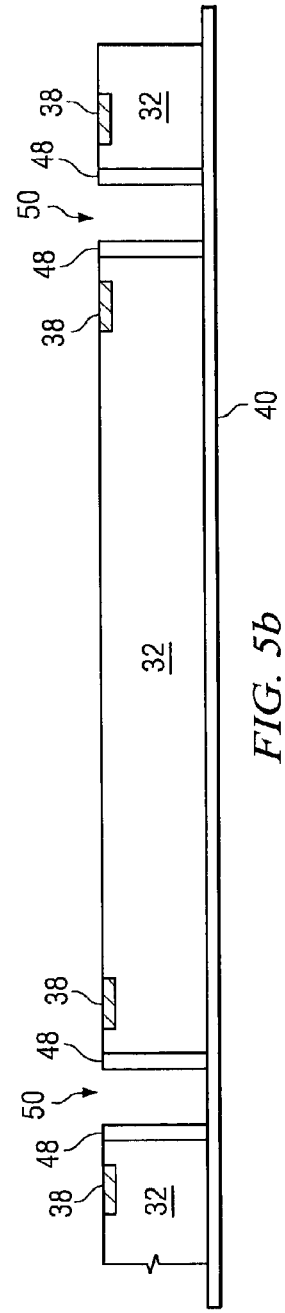

In FIG. 5b, the cross-sectional view of wafer 30, taken along line 5b-5b, shows via hole 50 cut into organic material 48 down to dicing tape 40. The laser drilling operation is centered about the channel of the saw street guide and makes a hole having a diameter less than the width of trench 42, which leaves a layer of organic material 48 surrounding via hole 50. The width of trench 42 is dependent on the width of saw street width, but typically smaller than the saw street width. The diameter of via hole 50 is typically about 10 μm to 100 μm, depending on the required via depth.

In FIG. 6a, semiconductor wafer 30 is shown with its plurality of die 32, separated by saw street guides 36 with via holes 50. A metal track or trace 52 is routed from each contact pad 38 to the corresponding via hole 50. Trace 52 is formed by a metal patterning process to connect contact pads 38 to via holes 50, which will be filled with conductive material in a later step. Traces 52 are provided for each contact pad and via hole pairing as shown. Some via holes 50 are dummy vias performing no electrical function. Accordingly, metal trace 52 need not be routed to every via depending on the device function. FIG. 6b is a cross-sectional view of wafer 30, taken along line 6b-6b, showing metal trace 52 connecting contact pad 38 to via hole 50.

In FIG. 7a, semiconductor wafer 30 is shown with its plurality of die 32, separated by saw street guides 36 with metal-filled vias 54. A conductive material is deposited into via hole 50 through a deposition process such as plating or plugging to form metal vias 54. The conductive material can be copper (Cu), aluminum (Al), tungsten (W), or alloys thereof, or mixtures of other conductive materials. Metal vias 54 are formed in and are surrounded by organic material 48. Metal via 54 electrically connects to contact pad 38 by way of trace 52. Traces 52 are provided for each contact pad and metal via pairing as shown. FIG. 7b is a cross-sectional view of wafer 30, taken along line 7b-7b, showing metal-filled via 54 electrically connecting to contact pad 38 through trace 52. The bottom of metal via 54 coincides with dicing tape 40.

In FIG. 8a, semiconductor wafer 30 is shown with its plurality of die 32, separated by saw street guides 36 with metal-filled vias 54. Dicing tape 40 is removed. Wafer 30 is inverted such that contact pads 38 and traces 52 are facing down, as shown in FIG. 8b which is a cross-sectional view of wafer 30 taken along line 8b-8b. Wafer support structure 56 is attached to the bottom side of wafer 30. Wafer support structure 56 can be made from glass, silicon substrate, or other material suitable for structurally supporting the wafer. A backside RDL 58 is formed on the backside of wafer 30. RDL 58 can be made with nickel (Ni), nickel vanadium (NiV), Cu, or Cu alloy. RDL 58 operates as an intermediate conductive layer to route electrical signals to various areas of the die, including active and passive circuits, and provides various electrical interconnect options during package integration, such as shown in FIGS. 15-18. Repassivation layer 60 is formed between the individual nodes of backside RDL 58 for electrical isolation. The repassivation layer can be made with silicon nitride (SiN), silicon dioxide (SiO2), silicon oxynitride (SiON), polyimide, benzocyclobutene (BCB), polybenzoxazole (PBO), or other insulating material.

In FIG. 9a, semiconductor wafer 30 is shown with its plurality of die 32, separated by saw street guides 36 with its plurality of die 32 having contact pads 38 connected to metal vias 64 by traces 52. Wafer support structure 56 is removed. Wafer 30 is again inverted such that contact pads 38 and traces 52 are facing up, as shown in FIG. 9b which is a cross-sectional view of wafer 30 taken along line 9b-9b. Dicing tape 62 is attached to the bottom side of semiconductor wafer 30 for structural support of the wafer during the second or final singulation to separate die 32. Metal vias 54 are cut through center area 68 by cutting tool 70 as shown in FIG. 9b. In one embodiment, cutting tool 70 can be a saw or laser. The cut extends down through RDL 58 to dicing tape 62 to completely sever metal vias 54 into two equal half-circle vias 64. A pick and place operation removes die 32 as individual units from dicing tape 62.

Figure 10A:
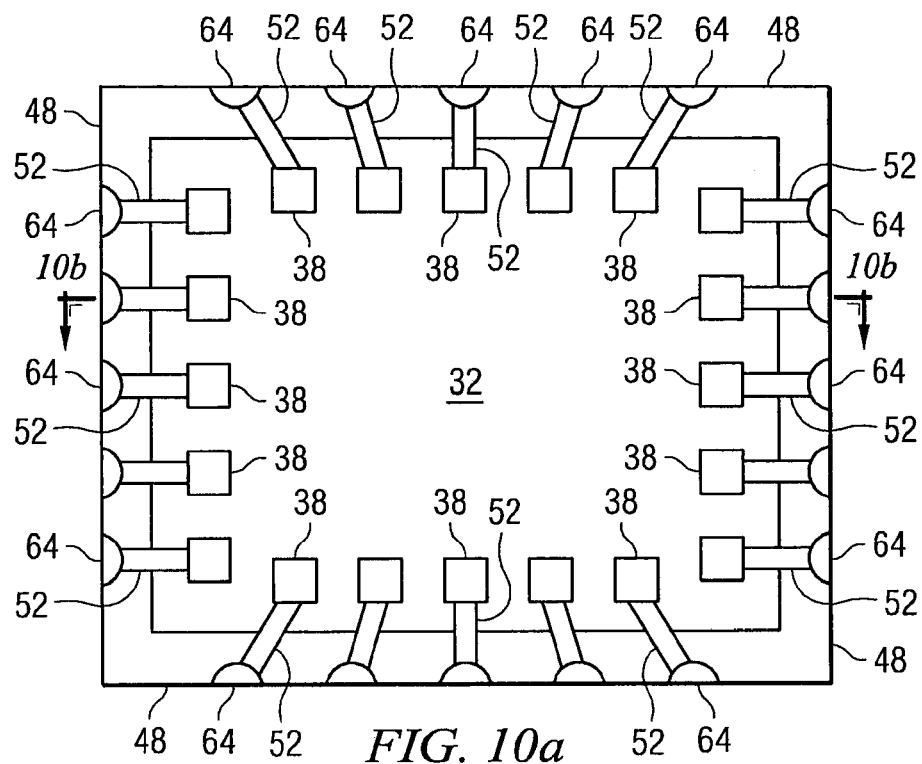
FIGS. 10a-10b illustrate top and side views of a semiconductor die with metal vias formed along the saw streets.
Figure 10B:
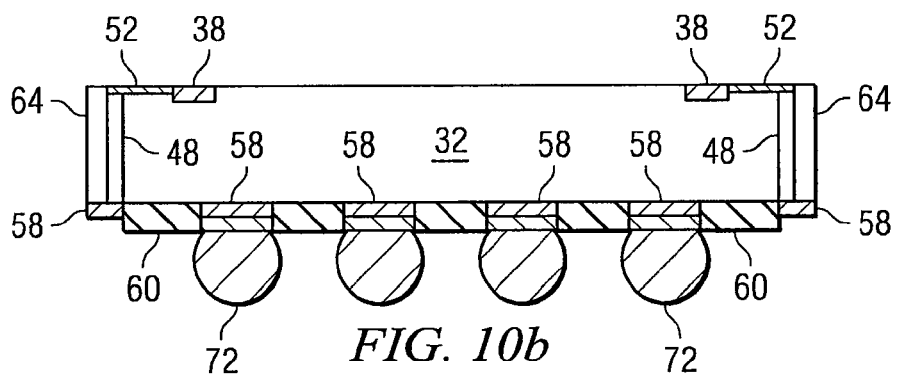

In FIG. 10a, semiconductor die 32 is shown with contact pads 38 connected to metal vias 64 by traces 52. FIG. 10b is a cross-sectional view of die 32, taken along line 10b-10b, showing a metal via on saw street configuration, as produced by the manufacturing steps of FIGS. 1-9. Solder bumps or balls 72 are formed on RDL 58.

Figure 11A:
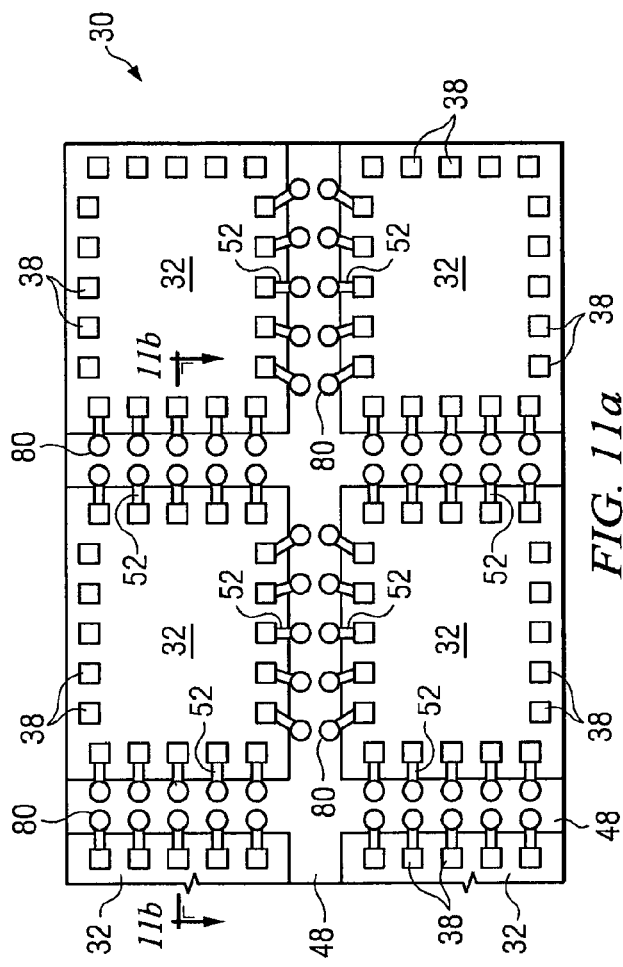
FIGS. 11a-11b illustrate top and side views of two side-by-side metal vias formed along the saw streets with redistribution layers on the backside of the die.
Figure 11B:
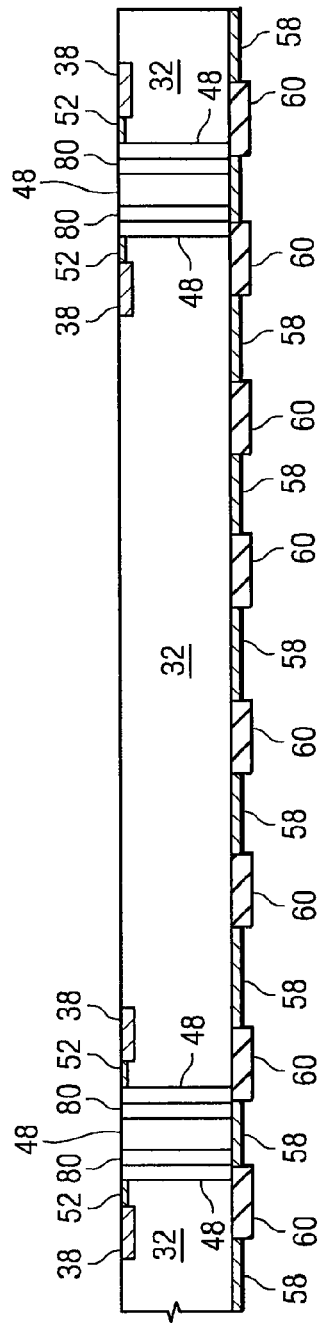

In FIG. 11a, semiconductor die 32 is shown with contact pads 38 connected to metal vias 80 by traces 52. FIG. 11b is a cross-sectional view of die 32, taken along line 11b-11b, showing metal vias 80 along saw street 36. The metal full-circle vias are produced by the steps described in FIGS. 1-9, with the exception that two via holes like 50 are formed side-by-side in organic material 48. The side-by-side via holes 50 are separated by organic material 48. Conductive traces 52 connect contact pads 38 and via holes 50. The side-by-side via holes are filled with conductive material to form metal vias 80.

In FIG. 12a, semiconductor die 32 is shown with contact pads 38 connected to metal vias 80 by traces 52. Dicing tape is applied to the back of semiconductor wafer 30 for structural support of the wafer during the final singulation to separate die 32, as shown in FIG. 12b which is a cross-sectional view taken along line 12b-12b. The second or final singulation to separate the plurality of die 32 is cut through organic material 48 along line 82 between the side-by-side vias 80 with a cutting tool like 70. The singulation between the vias 80 results in the metal vias on saw street configuration.

Figure 13A:
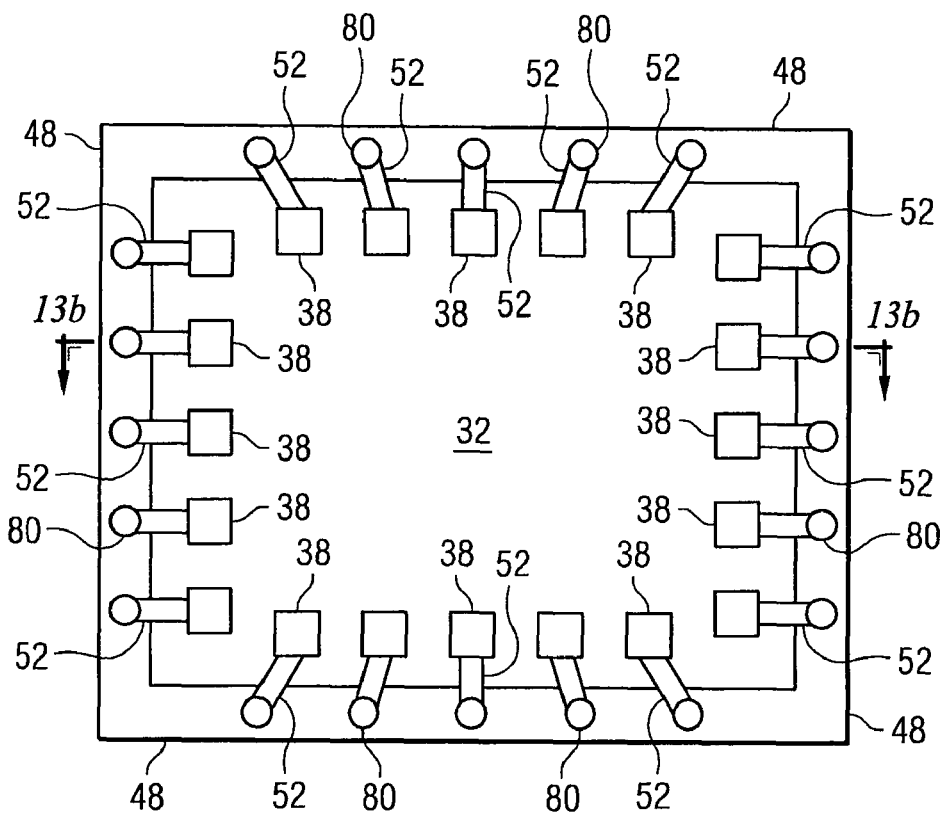
FIGS. 13a-13b illustrate top and side views of a semiconductor die with metal vias along the saw streets.
Figure 13B:
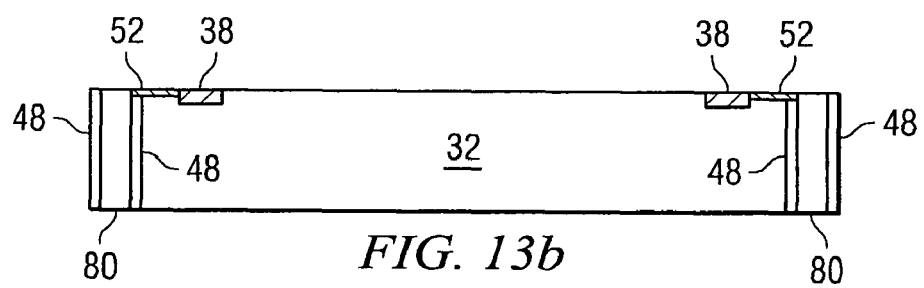

In FIG. 13a, semiconductor die 32 is shown with contact pads 38 connected to metal vias 80 by traces 52. FIG. 13b is a cross-sectional view of die 32, taken along line 13b-13b, showing a metal via on saw street configuration. The metal full-circle vias are produced by the steps described in FIGS. 1-9 and 11-12. The side-by-side via holes like 50 are separated by organic material 48. Conductive traces like 52 connect the contact pads and via holes. The side-by-side via holes are filled with conductive material to form metal vias 80. The final singulation to separate the plurality of die 32 is cut through organic material 48 between the side-by-side metal vias 80 resulting in the metal vias on saw street configuration.

Figure 14:
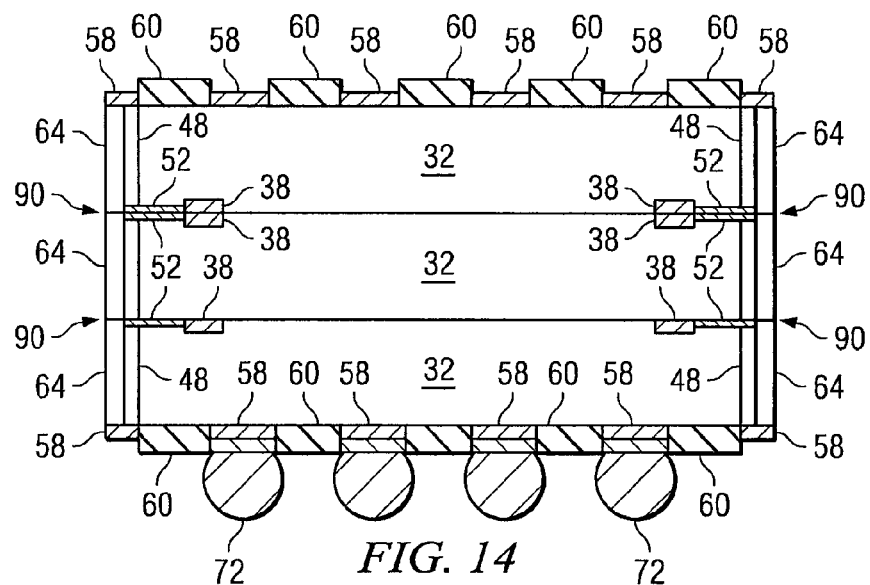
FIG. 14 illustrates die-to-die stacking using direct metal-to-metal via bonding.

FIG. 14 illustrates direct die-to-die stacking using direct via metal bonding. A plurality of die 32 is stacked as shown to suit a particular application. Each of the metal half-vias 64 can be joined together as shown by union 90 using a direct via metal bonding process or solder paste. Alternately, semiconductor die 32 with metal full-vias 80 can be joined together by union 90 using a direct via metal bonding process or solder paste. The top semiconductor die is shown stacked in the inverted position to make use of backside RDL 58 for interconnect to other devices and packages (not shown). RDL 58 is separated and electrically isolated by repassivation layer 60. The bottom semiconductor die 32 has solder bumps 72 formed on RDL 58 separated by repassivation layers 60 for electrical isolation. The backside RDL 58 provides intermediate interconnect from solder bumps 72 to the active surface of the bottom semiconductor die 32. The interconnection between RDLs in the die-to-die stacking can be used with or without solder bumps 72.

Figure 15:
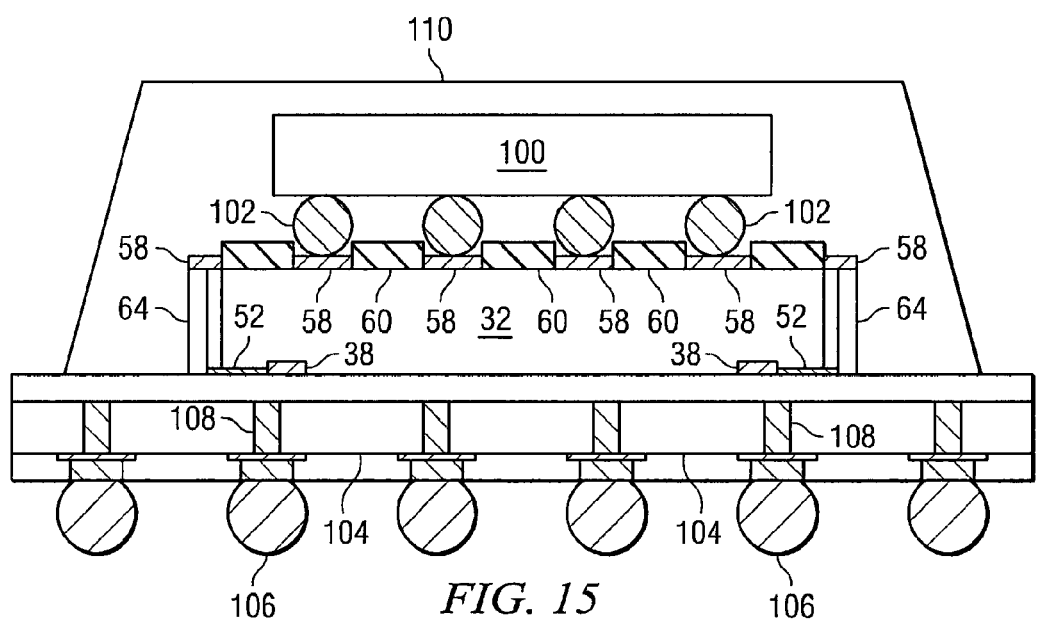
FIG. 15 illustrates the semiconductor die with metal vias connected to a second die with solder bumps.

In FIGS. 15-18 shows various packaging applications using, in part, an interconnect technique with the THVs formed on saw streets with backside RDLs. FIG. 15 has semiconductor die 100 connecting through solder bumps 102 to backside RDL 58 on die 32. Backside RDL 58 electrically connect to active circuits on die 32, as well as providing interconnect to die 100. Die 32 is supported by substrate 104. Contact pads 38 and/or metal vias 64 or 80 electrically connect to solder bumps 106 through conductive layer 108. The packages are sealed by epoxy encapsulant 110.

Figure 16:
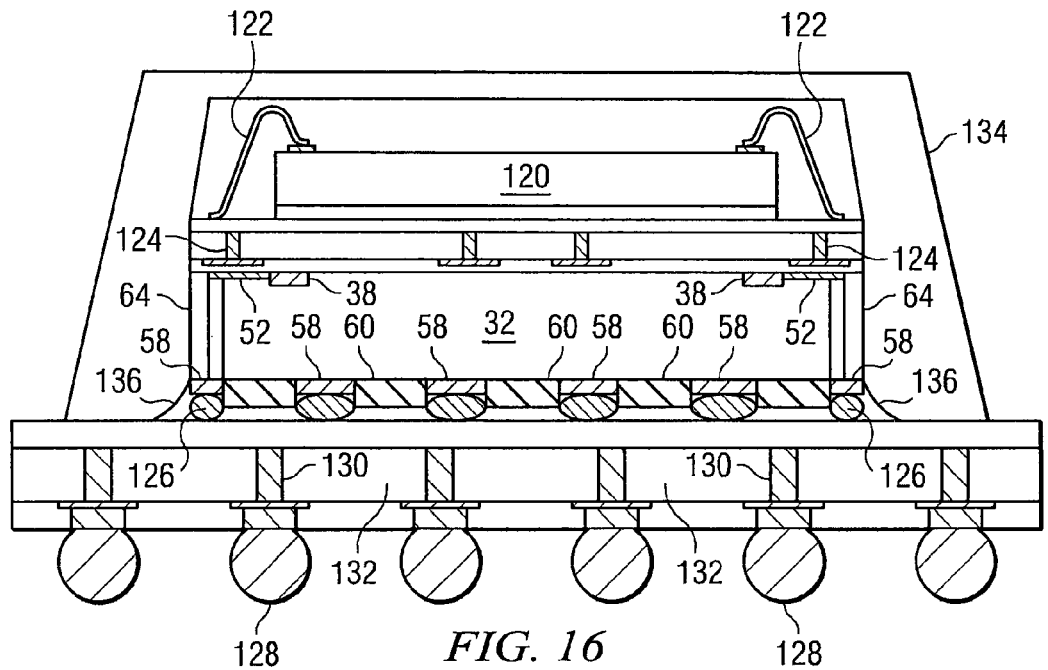
FIG. 16 illustrates the semiconductor die with metal vias connected to a second die with bond wires.

FIG. 16 shows semiconductor die 120 electrically connected to contact pad 38 and metal vias 64 or 80 through bond wires 122 and conductive layer 124. Backside RDL 58 electrically connects to active circuits on die 32 and solder bumps 126, which in turn electrically connect to solder bumps 128 through conductive layer 130. Die 32 is supported by substrate 132. The packages are sealed by epoxy encapsulant 134. An underfill material 136 can be used for stress relief.

Figure 17:
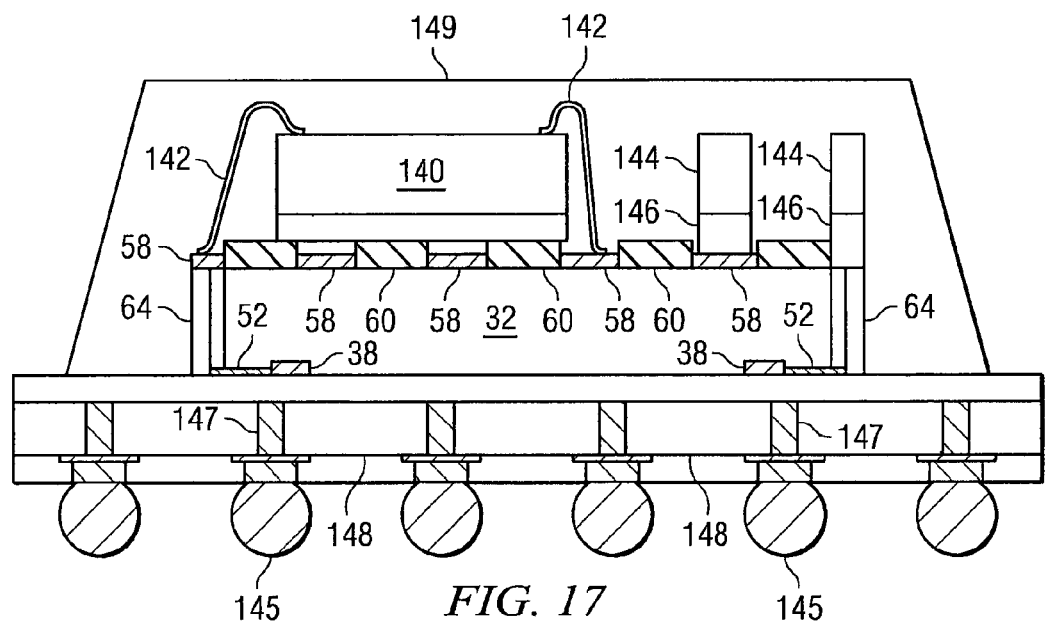
FIG. 17 illustrates another embodiment of interconnecting die using metal vias on saw streets and backside RDL.

FIG. 17 shows semiconductor die 140 electrically connected through bond wires 142 to backside RDL 58 of semiconductor die 32. Backside RDL 58 electrically connect to active circuits on die 32, as well as providing interconnect to die 140. Passive devices 144 also connect to backside RDL 58 with solder paste 146. Metal vias 64 electrically connect to solder bumps 145 through conductive layer 147. Die 32 is supported by substrate 148. The packages are sealed by epoxy encapsulant 149.

Figure 18:
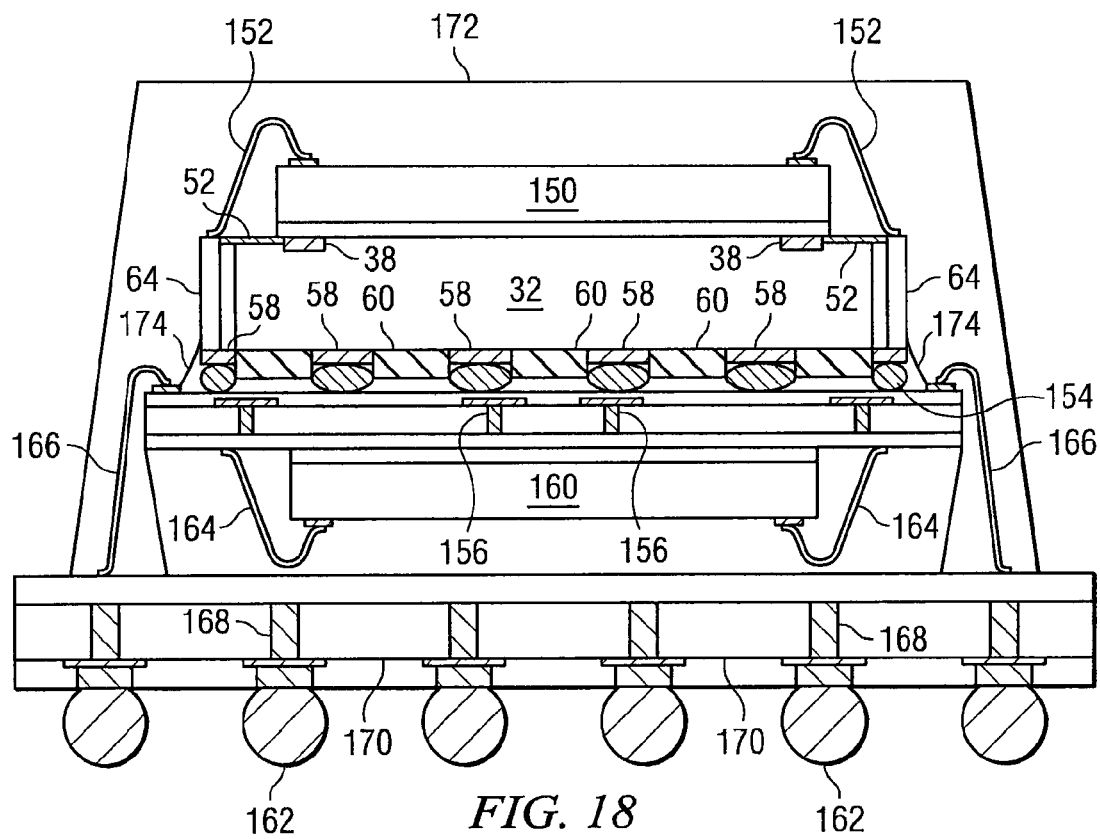
FIG. 18 illustrates another embodiment of interconnecting die using metal vias on saw streets and backside RDL.

FIG. 18 shows semiconductor die 150 electrically connected to metal vias 64 or 80 by way of bond wires 152. Solder bumps 154 electrically connect the backside of RDL 58 to conductive layer 156, which connect semiconductor die 160 with solder bumps 162 by way of bond wires 164, bond wires 166, and conductive layer 168. Die 32 is supported by substrate 170. The packages are encased by epoxy encapsulant 172. An underfill material 174 can be used for stress relief.

In summary, stackable semiconductor die has been described with THVs formed in the saw streets. The semiconductor die use a redistribution layer, separated by a repassivation layer, to increase signal routing options and density. The RDL, in addition to the THV, provides more signal routing functionality and flexibility within the package.

While one or more embodiments of the present invention have been illustrated in detail, the skilled artisan will appreciate that modifications and adaptations to those embodiments may be made without departing from the scope of the present invention as set forth in the following claims

What is claimed is:

1. A semiconductor wafer, comprising:
   a plurality of semiconductor die each with a plurality of contact pads disposed on a first surface of the semiconductor;
   a trench formed between the semiconductor die;
   an organic material deposited in the trench;
   a plurality of conductive vias formed through the organic material, wherein a width of the conductive vias is less than a width of the organic material in the trench;
   a plurality of conductive traces formed over the first surface electrically connecting a first portion of the conductive vias to the contact pads, wherein a second portion of the conductive vias is electrically isolated from the conductive traces;
   a plurality of redistribution layer (RDL) nodes formed over a second surface of the semiconductor die opposite the first surface, the RDL nodes extending across the second surface of the semiconductor die to route electrical signals to areas on the second surface including a central region of the semiconductor die for vertical electrical interconnect, wherein a first portion of the RDL nodes is electrically connected to the conductive vias and a second portion of the RDL nodes is electrically isolated from the conductive vias; and
   a plurality of repassivation layers formed on the second surface of the semiconductor die for electrical isolation between the RDL nodes.

2. The semiconductor wafer of claim 1, wherein a width of the trench is increased by creating additional space between the semiconductor die.

3. The semiconductor wafer of claim 1, wherein the semiconductor wafer is singulated through the conductive vias to separate the semiconductor die.

4. The semiconductor wafer of claim 1, further including a plurality of side-by-side conductive vias formed within the organic material.

5. The semiconductor wafer of claim 4, wherein the semiconductor wafer is singulated between the side-by-side conductive vias to separate the semiconductor die.

6. The semiconductor wafer of claim 1, further including a plurality of stacked semiconductor die electrically connected through the RDL nodes and conductive vias.

7. The semiconductor wafer of claim 1, wherein the repassivation layer includes silicon nitride, silicon dioxide, silicon oxynitride, polyimide, benzocyclobutene, or polybenzoxazoles.

8. A semiconductor wafer, comprising:
   a plurality of semiconductor die each with a plurality of contact pads disposed on a first surface of the semiconductor;
   an organic material formed around the semiconductor die;
   a plurality of conductive vias formed through the organic material;
   a plurality of conductive traces formed over the first surface electrically connecting a first portion of the conductive vias to the contact pads, wherein a second portion of the conductive vias is electrically isolated from the conductive traces;
   a plurality of redistribution layer (RDL) nodes formed over a second surface of the semiconductor die opposite the first surface, the RDL nodes extending across the second surface of the semiconductor die to route electrical signals to areas on the second surface including a central region of the semiconductor die for vertical electrical interconnect, wherein a first portion of the RDL nodes is electrically connected to the conductive vias and a second portion of the RDL nodes is electrically isolated from the conductive vias; and
   a plurality of repassivation layers formed on the second surface of the semiconductor die for electrical isolation between the RDL nodes.

9. The semiconductor wafer of claim 8, wherein the semiconductor wafer is singulated through the conductive vias to separate the semiconductor die.

10. The semiconductor wafer of claim 8, further including a plurality of side-by-side conductive vias formed within the organic material.

11. The semiconductor wafer of claim 10, wherein the semiconductor wafer is singulated between the side-by-side conductive vias to separate the semiconductor die.

12. The semiconductor wafer of claim 8, further including a plurality of stacked semiconductor die electrically connected through the RDL nodes and conductive vias.

13. The semiconductor wafer of claim 8, wherein the repassivation layer includes silicon nitride, silicon dioxide, silicon oxynitride, polyimide, benzocyclobutene, or polybenzoxazoles.

14. A semiconductor wafer, comprising:
   a plurality of semiconductor die each with a plurality of contact pads disposed on a first surface of the semiconductor;
   an organic material formed around the semiconductor die;
   a plurality of conductive vias formed through the organic material;
   a plurality of conductive traces formed over the first surface electrically connecting the conductive vias to the contact pads;
   a plurality of redistribution layer (RDL) nodes formed over a second surface of the semiconductor die opposite the first surface, the RDL nodes extending across the second surface of the semiconductor die to route electrical signals to areas on the second surface including a central region of the semiconductor die for vertical electrical interconnect, wherein a first portion of the RDL nodes is electrically connected to the conductive vias and a second portion of the RDL nodes is electrically isolated from the conductive vias; and
   a plurality of repassivation layers formed on the second surface of the semiconductor die for electrical isolation between the RDL nodes.

15. The semiconductor wafer of claim 14, wherein the semiconductor wafer is singulated through the conductive vias to separate the semiconductor die.

16. The semiconductor wafer of claim 14, further including a plurality of side-by-side conductive vias formed within the organic material.

17. The semiconductor wafer of claim 16, wherein the semiconductor wafer is singulated between the side-by-side conductive vias to separate the semiconductor die.

18. The semiconductor wafer of claim 14, further including a plurality of stacked semiconductor die electrically connected through the RDL nodes and conductive vias.

19. The semiconductor wafer of claim 14, wherein the repassivation layer includes silicon nitride, silicon dioxide, silicon oxynitride, polyimide, benzocyclobutene, or polybenzoxazoles.

20. A semiconductor wafer, comprising:
   a plurality of semiconductor die each with a plurality of contact pads disposed on a first surface of the semiconductor;
   an organic material formed around the semiconductor die;
   a plurality of conductive vias formed through the organic material;
   a plurality of conductive traces formed over the first surface electrically connecting the conductive vias to the contact pads;
   a plurality of redistribution layer (RDL) nodes formed over a second surface of the semiconductor die opposite the first surface, the RDL nodes extending across the second surface of the semiconductor die to route electrical signals to areas on the second surface of the semiconductor die including a central region of the semiconductor die for vertical electrical interconnect; and
   a plurality of repassivation layers formed on the second surface of the semiconductor die for electrical isolation between the RDL nodes.

21. The semiconductor wafer of claim 20, wherein the semiconductor wafer is singulated through the conductive vias to separate the semiconductor die.

22. The semiconductor wafer of claim 20, further including a plurality of side-by-side conductive vias formed within the organic material.

23. The semiconductor wafer of claim 22, wherein the semiconductor wafer is singulated between the side-by-side conductive vias to separate the semiconductor die.

24. The semiconductor wafer of claim 20, further including a plurality of stacked semiconductor die electrically connected through the RDL nodes and conductive vias.

25. The semiconductor wafer of claim 20, wherein the repassivation layer includes silicon nitride, silicon dioxide, silicon oxynitride, polyimide, benzocyclobutene, or polybenzoxazoles.

* * * * *

UNITED STATES PATENT AND TRADEMARK OFFICE
CERTIFICATE OF CORRECTION

PATENT NO. : 7,829,998 B2
APPLICATION NO. : 11/861244
DATED : November 9, 2010
INVENTOR(S) : Byung Tai Do et al.

Page 1 of 1

It is certified that error appears in the above-identified patent and that said Letters Patent is hereby corrected as shown below:

In the Specification

Column 1, line 20, under CROSS-REFERENCE TO RELATED PATENT APPLICATIONS, delete application number "11/891,233" and replace with application number -- 11/861,233 --.

Signed and Sealed this
Twenty-eighth Day of April, 2015

Michelle K. Lee
*Director of the United States Patent and Trademark Office*